US006839233B2

United States Patent
Cravens et al.

(10) Patent No.: US 6,839,233 B2
(45) Date of Patent: Jan. 4, 2005

(54) REMOVABLE FAN BAY

(75) Inventors: Zachary A. Cravens, Round Rock, TX (US); Christopher L. Holderness, Pflugerville, TX (US); Brently L. Cooper, Hutto, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 10/335,704

(22) Filed: Jan. 2, 2003

(65) Prior Publication Data

US 2004/0130872 A1 Jul. 8, 2004

(51) Int. Cl.[7] .................................................. H05K 7/20
(52) U.S. Cl. ..................... 361/695; 361/825; 415/213.1
(58) Field of Search .................. 62/259.2; 165/80.3, 165/121, 122, 126; 361/68.7, 694–695, 715, 725–727, 825; 454/184; 415/213.1, 214.1, 220; 417/423.14, 423.15, 360

(56) References Cited

U.S. PATENT DOCUMENTS

| 5,572,403 | A |  | 11/1996 | Mills ........................... 361/695 |
|---|---|---|---|---|
| 6,031,719 | A |  | 2/2000 | Schmitt et al. ............. 361/695 |
| 6,115,250 | A | * | 9/2000 | Schmitt ....................... 361/695 |
| 6,186,889 | B1 |  | 2/2001 | Byrne ......................... 454/184 |
| 6,288,897 | B1 | * | 9/2001 | Fritschle et al. ............ 361/687 |
| 6,351,380 | B1 |  | 2/2002 | Curlee et al. ............... 361/695 |
| 6,373,698 | B1 |  | 4/2002 | Christensen ................ 361/695 |
| 6,388,880 | B1 |  | 5/2002 | El-Ghobashy et al. ...... 361/695 |
| 6,392,893 | B1 | * | 5/2002 | Carney et al. .............. 361/727 |
| 6,556,437 | B1 |  | 4/2003 | Hardin ........................ 361/687 |
| 6,592,327 | B2 | * | 7/2003 | Chen et al. ............... 415/213.1 |
| 6,603,661 | B2 | * | 8/2003 | Smith et al. ................. 361/695 |
| 6,604,916 | B2 |  | 8/2003 | Lu et al. ..................... 417/360 |
| 6,616,525 | B1 | * | 9/2003 | Giraldo et al. .............. 454/184 |
| 6,663,416 | B2 | * | 12/2003 | Huang et al. ............... 439/485 |

* cited by examiner

*Primary Examiner*—Gregory D. Thompson
(74) *Attorney, Agent, or Firm*—Baker Botts L.L.P.

(57) ABSTRACT

A removable fan bay for a computer system or information handling system is provided that permits the hot swapping of individual fans of the fan bay. The removal of the fan bay enclosures results in the removal of all of the fans of the fan bay. The fan bay is held in place by a securing mechanism that includes a latch and a receiving bracket. The latch includes a retractable handle. When the handled is placed in the raised position, a shoulder in the latch disengages from the receiving bracket, permitting the latch to be released from the receiving bracket and permitting the fan bay to be removed from the chassis of the computer system.

12 Claims, 5 Drawing Sheets though the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

REMOVABLE FAN BAY

TECHNICAL FIELD

The present disclosure relates generally to the field of computer systems and information handling systems, and, more particularly, to a removable fan bay for a computer system or information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

An information handling system may include a number of fans within the chassis of the information handling system. In the case of a computer system, for example, the fans blow a stream of air over certain electrical components, dissipating hear generated by closely spaced components so that the components operate within a desired temperature range. Fan cooling systems for computer systems are generally described in U.S. Pat. No. 5,572,403 to Mills, which is incorporated herein by reference in its entirety.

As computer systems become smaller in size, the components become more crowded within the chassis of the computer system. The reduction in size of the chassis of the computer system may reduce the serviceability of the computer system, as certain components or groups of components may completely block access to another component or group of components. If certain groups of components cannot be easily removed from the chassis of the computer system, the serviceability and modularity of the computer system is compromised.

Some computer systems, including server systems, may have heat dissipation requirements that necessitate the use of multiple fans. In some designs, multiple individual fans may be located at various points in the chassis. These fans may be individually hot swappable. In other designs, the fans may be arranged in the computer system as part of an integrated fan unit that comprises multiple fans. In this design, the fan units are not hot swappable. A single fan cannot be swapped from the unit unless the entire integrated fan unit is removed from the chassis.

SUMMARY

In accordance with the present disclosure, a removable fan bay system is provided. The removable fan bay includes a single enclosure that can house multiple fans, each housed within a slot in the enclosure. Each fan is hot swappable. The entire fan bay, including all fans, can be removed from the computer system. The fan bay is held in place by a securing mechanism that includes a latches on opposite sides of the fan bay and corresponding receiving brackets on the interior of the chassis of the computer system. The latches include a shoulder that is biased outward but pivotable inward. The shoulder of each latch is engaged by a slot in the receiving bracket. When the retractable handle of a latch is placed in the raised position, the shoulder of the latch is pivoted inward, disengaging the shoulder from the slot in the receiving bracket and disengaging the latch from the receiving bracket, thereby allowing the entire fan bay to be removed from the computer system.

One technical advantage of the present disclosure is a fan bay design that permits both the individual hot swapping of fans and the removal of the entire enclosure of fans. The fan bay of the present disclosure allows for the removal of each fan of the fan bay at the discretion of the user without necessitating the removal of all the fans of the fan bay. In addition, all of the fans may be removed from the computer system by removing the entire fan bay, thereby allowing access to those components of the computer system that may be obstructed by the fan bay. Another technical advantage of the present disclosure is a fan bay that may be toollessly inserted or removed from the chassis of the computer system. The fan bay of the present disclosure is held in place by a latch and receiving bracket combination. When the handle of the latch is raised to lift the fan bay from the chassis, the latch disengages from the receiving bracket, allowing the fan bay to be removed from the chassis of the computer system. Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
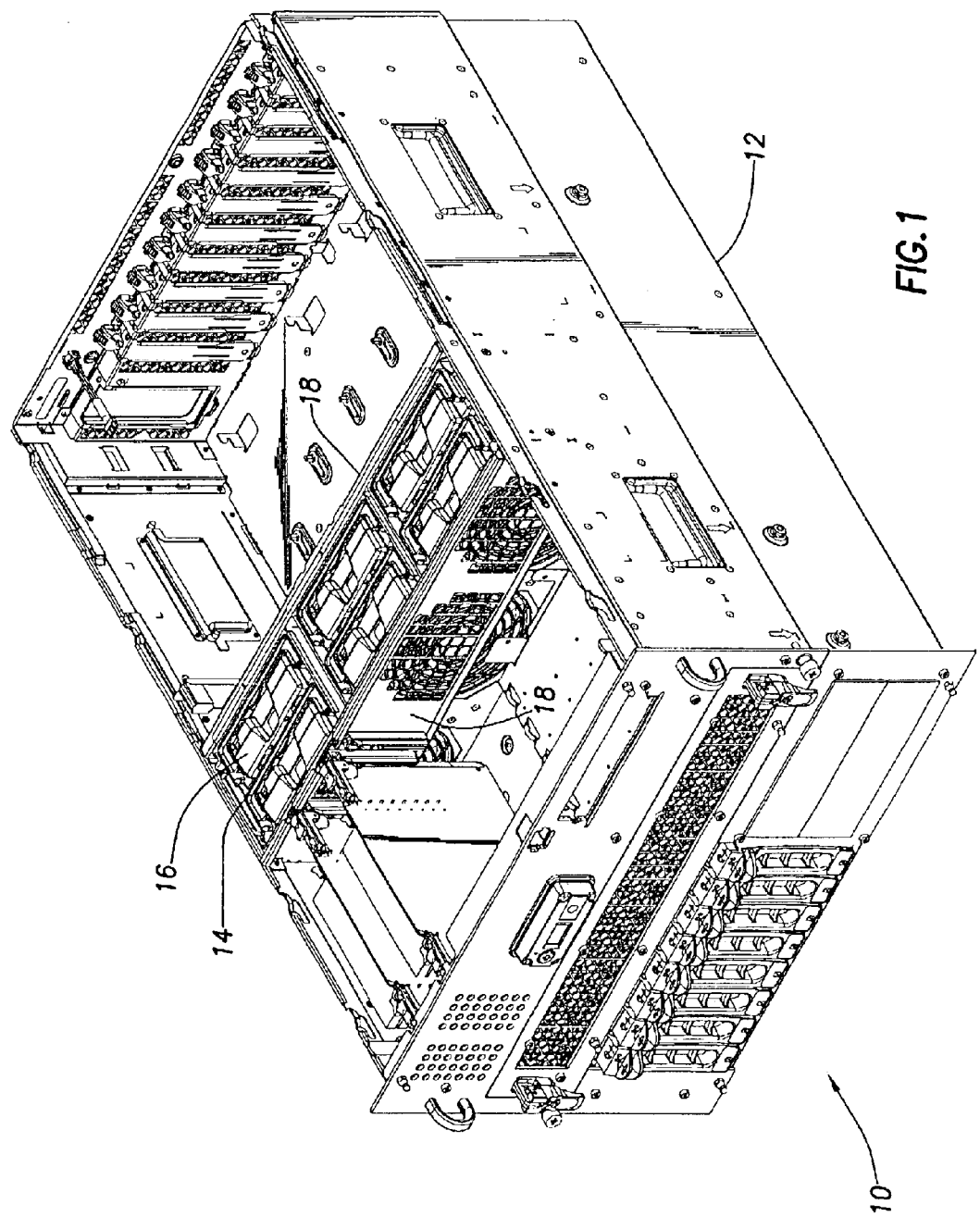
FIG. 1 is a pictorial view of a removable fan bay within the chassis of a computer system.
Figure 2:
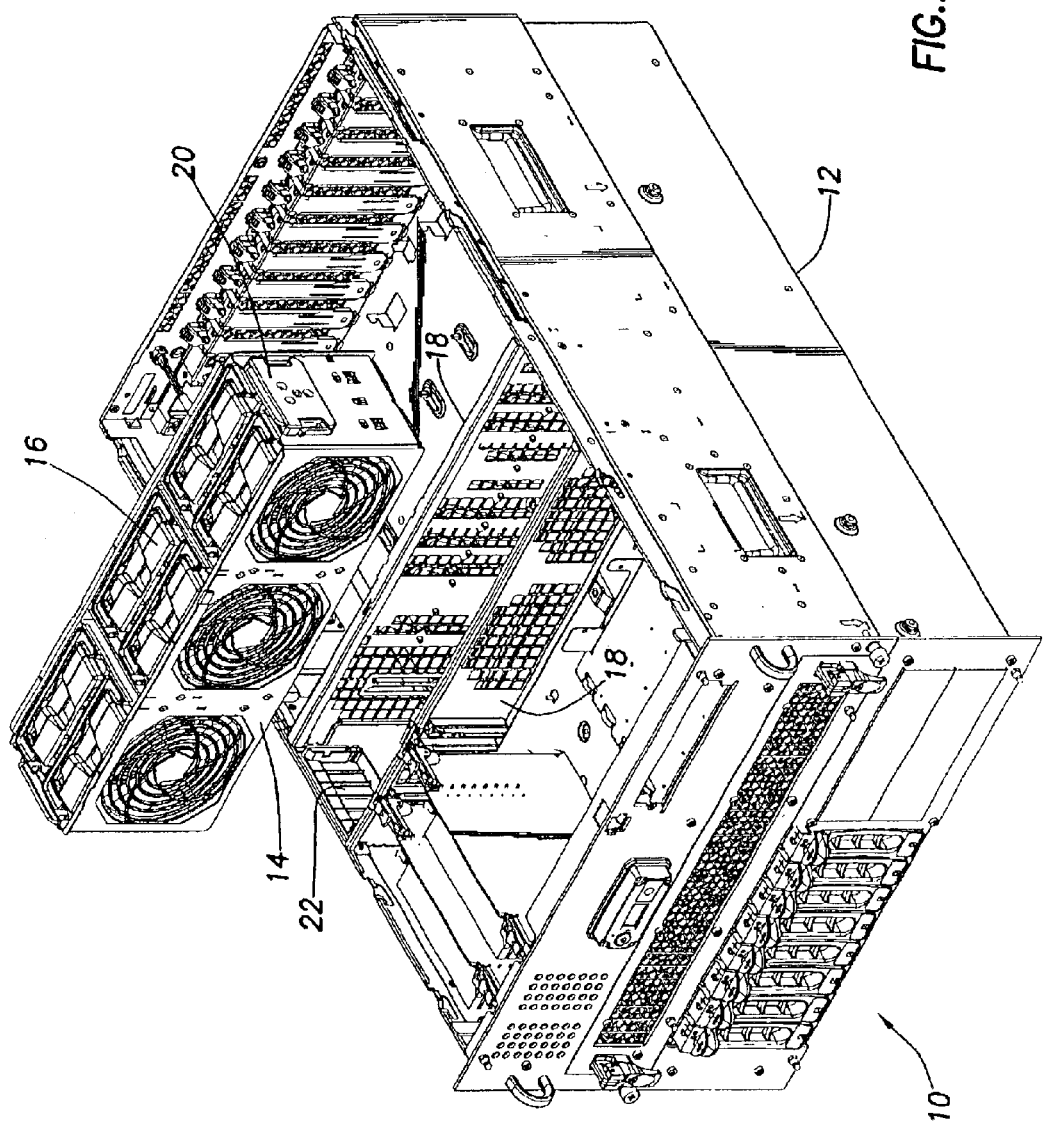
FIG. 2 is a partially exploded view of FIG. 1, depicting the removal of the removable fan bay from the chassis of the computer system.
Figure 3:
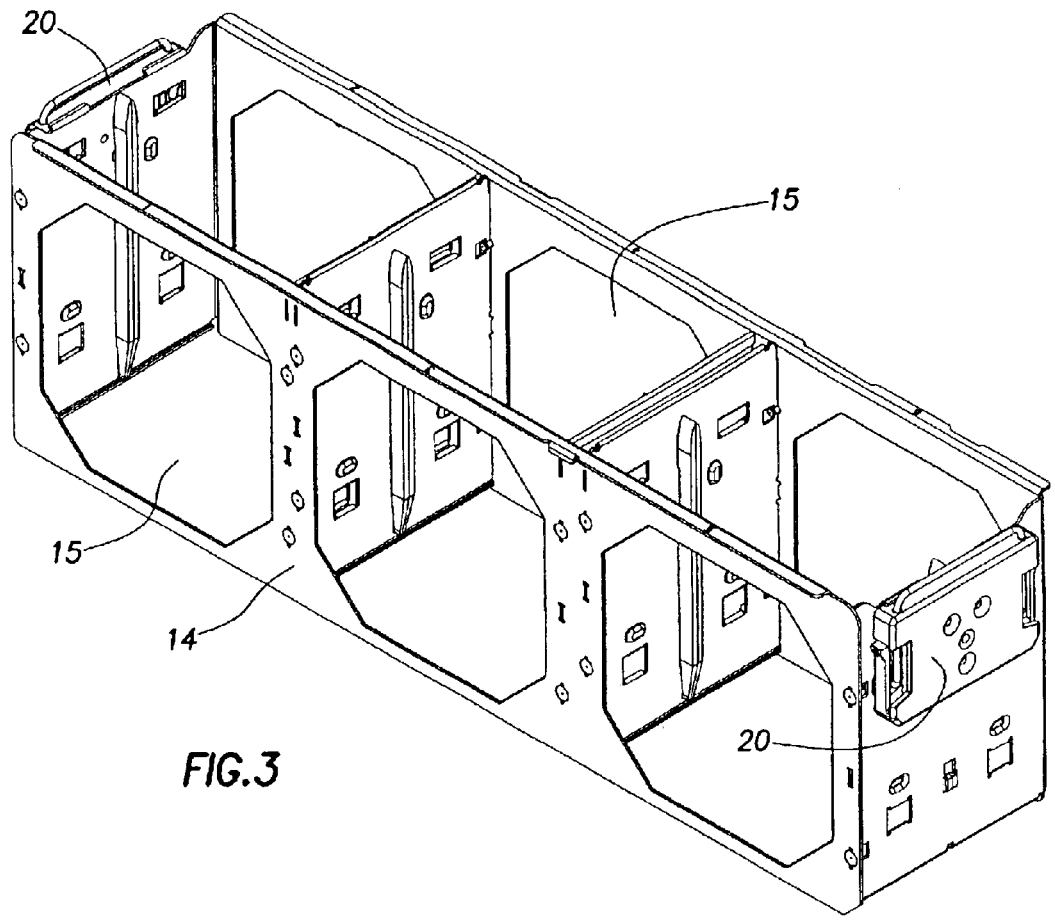
FIG. 3 is pictorial view of a fan bay with all of the fans removed therefrom.

The present disclosure concerns a removable fan bay for a computer system. Shown in FIG. 1 is a chassis 12 for a computer system, which is indicated generally at 10. Shown in the center of chassis 12 is a fan bay 14, which is positioned between retaining walls 18. Fan bay 14 includes a grid of six slots, each of which houses a fan 16. Each of fans 16 includes a pivotable handle for lifting the fan from the fan bay. Each fan of fan 16 of fan bay 14 is individually coupled to a power source. In one example, the power connector of each fan may be coupled to a power source on the motherboard of the computer system. Thus, a fan is coupled to a power source in the motherboard as the fan is inserted in the fan bay, and the fan is removed from the power source as the fan is lifted from the fan bay by its handle. Shown in FIG. 2 is a partially exploded view of chassis 12 and fan bay 14 in which fan bay 14 is removed from chassis 12. Fan bay 14 includes two latches 20 that are positioned on opposite sides of the fan bay. Fan bay 14 is mounted in chassis 12 by coupling latches 20 to corresponding receiving brackets 22. Receiving brackets 22 are mounted to the interior of chassis 12. Shown in FIG. 3 is fan bay 14 with all fans removed. Fan bay 14 includes a number of plenum openings 15 along the length of fan bay 14 for the passage of air through the fans of the fan bay. Latches 20 are shown on opposite sides of fan bay 14.

Figure 4:
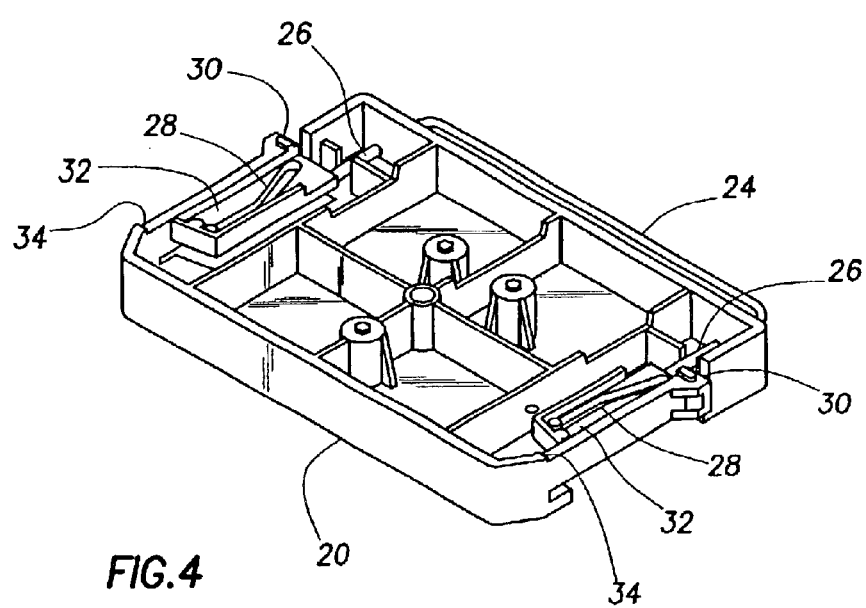
FIG. 4 is a view of the interior of a latch.

Shown in FIG. 4 is the interior of latch 20. The portion of latch 20 that is shown in FIG. 4 is positioned adjacent to fan bay 14. Although this side of latch 20 may not be visible during the operation of fan bay 14, this view of latch 20 is shown so that that operation of the latching and biasing mechanisms of latch 20 can be described. Latch 20 includes a handle 24 that terminates in a pair of rods 26. Handle 24 of FIG. 4 is in the down position. The terminal end of rods 26 is turned at an angle and travels within channel 28. When the handle 24 is in the down position, the terminal end of rod 26 is positioned in the lower range of channel 28. Channel 28 is housed within a channel housing 32. Channel housing 32 includes a shoulder 30, which is adjacent to the upper range of channel 28. Channel housing 32 is pivotable about a pivot point 34. When the handle 24 is in a down position, and the terminal end of each rod 26 is positioned in the lower range of channel 28, each channel housing 32 is biased about pivot point 34 such that each shoulder 30 may be forced toward the interior of latch 20 and will spring outward to the position shown in FIG. 4 when the force is removed.

Figure 5:
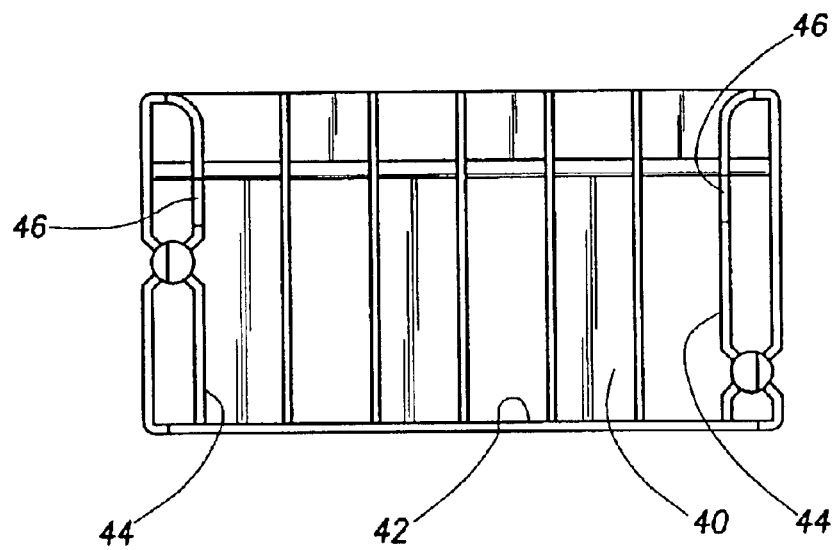
FIG. 5 is a view of a receiving bracket.
Figure 6:
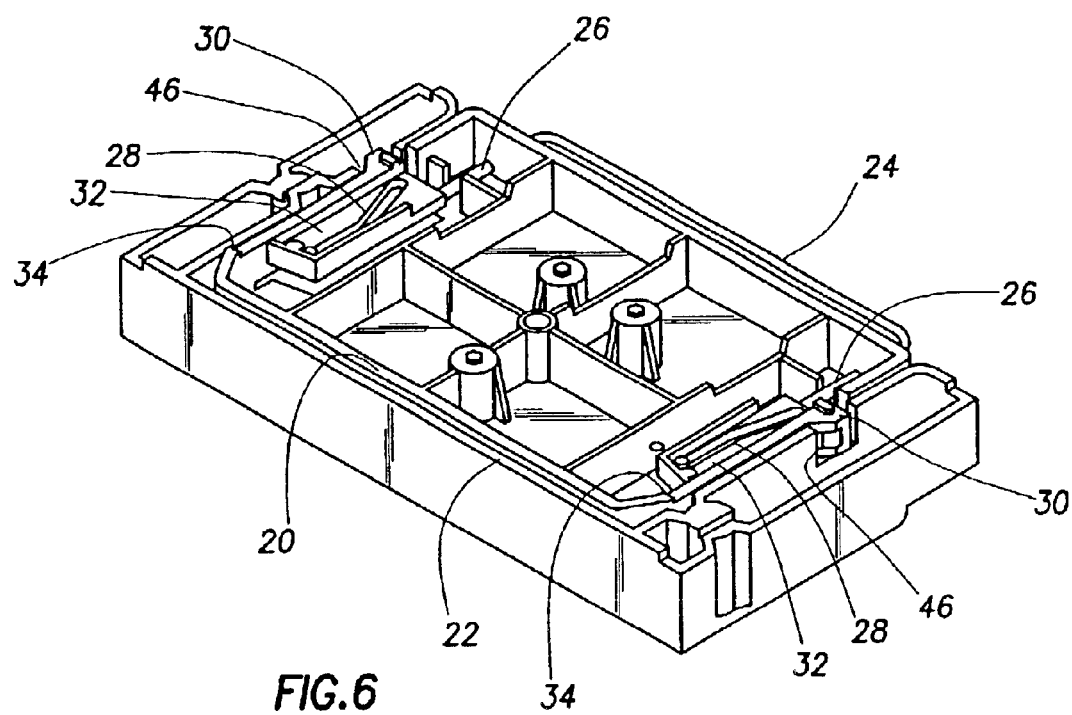
FIG. 6 is a view of an engaged latch within a receiving bracket.

Shown in FIG. 5 is a receiving bracket 22, which is mounted to the interior of chassis 12. Receiving bracket 22 includes a back 40, a base 42, and sides 44, each having a slot 46. Shown in FIG. 6 is a latch 20 within receiving bracket 22. As latch 22 is slid downward toward the base 42, shoulders 30 of latch 20 are pushed inward toward the center of latch 20 by the sides 44 of receiving bracket 22. When shoulders 30 reach slots 46, shoulders 30 spring outward and are lodged within slots 46. As shown in FIG. 6, the position of shoulders 30 within slots 46 of receiving bracket 22 holds latch 20 in place within receiving bracket 22 when the handle 24 of latch 20 is in the down position.

Figure 7:
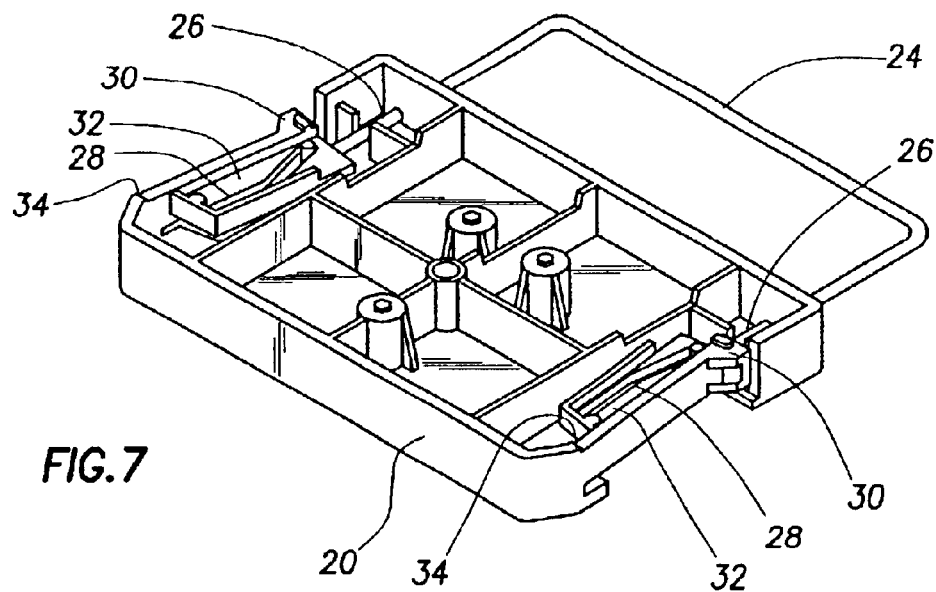
FIG. 7 is a view of the interior of a latch with its handled in the raised position.
Figure 8:
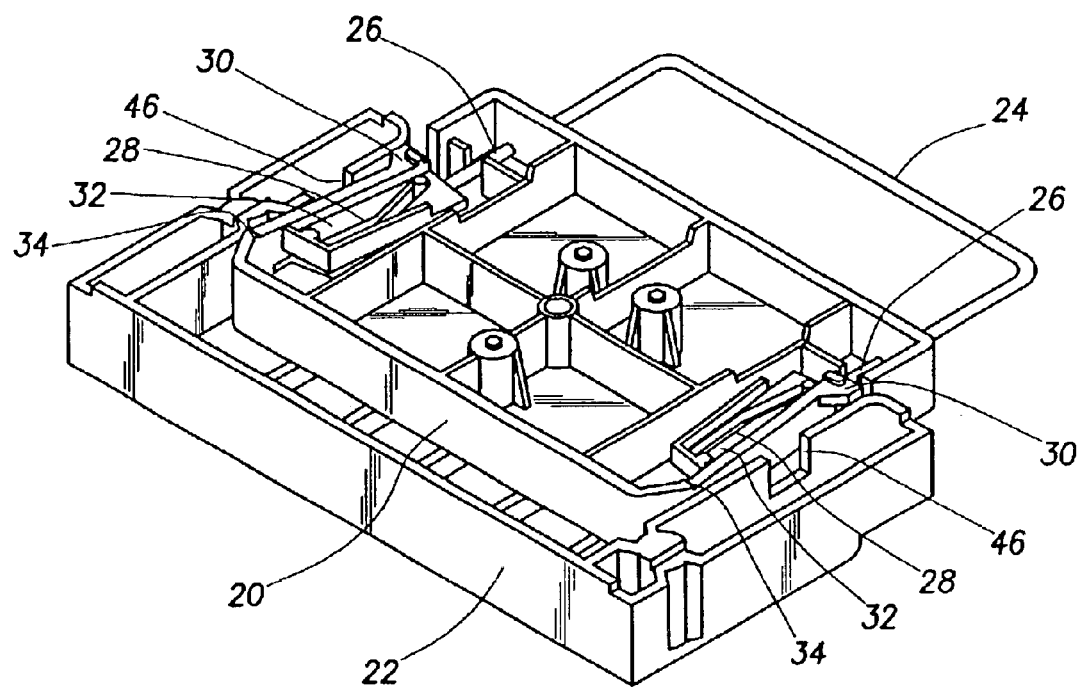
FIG. 8 is a view of a disengaged latch within a receiving bracket.

Shown in FIG. 7 is the interior of latch 20 when the handle 24 is in the raised or up position 24. The terminal end of rod 26 is now in the upper range of channel 28. Raising handle 24 causes the terminal end of rod 26 to travel the length of channel 28. The angle in each channel 28 and the rigidity of each rod 26 has the effect of pulling shoulder 30 in the direction of the center of latch 20. Shown in FIG. 8 is latch 20, with its handle in the raised position, within receiving bracket 22. Each of shoulders 30 of latch 20 of FIG. 8 has retracted from slots 46 of receiving bracket 22, allowing latch 20 to be raised from receiving bracket 22. Thus, to remove fan bay 14 from chassis 12, the handle 24 of each latch is raised, causing the shoulders 30 of latches 20 to disengage from slots 46 of receiving brackets 22. As fan bay 14 is lifted, each of the fans 16 is disengaged from its power source.

The removable fan bay of the present disclosure permits the hot swapping of each individual fan without the necessity of removing the entire fan bay from the computer system. If one of the fans of the fan bay is to be replaced, the individual fan is simply removed from the fan bay. If the area below the fan bay is to be serviced, the entire fan bay can be removed as a single unit. In this way, the user has the flexibility of hot swapping a single fan or removing the entire fan assembly. Although the present disclosure has been described in detail, it should be understood that various changes, substitutions, and alterations can be made hereto without departing from the spirit and the scope of the invention as defined by the appended claims.

What is claimed is:

1. A fan bay for an information handling system, comprising:
   an enclosure having a plurality of slots, each sized to house a fan and each slot arranged to permit the individual hot swapping of each fan;
   latches disposed on opposite sides of the fan bay, wherein each latch is sized to be received and engaged by a receiving bracket in the information handling system, wherein each latch includes a retractable handle, and wherein the lifting of each retractable handle causes each latch to disengage from a receiving bracket of the information handling system;
   wherein the removal of the enclosure from the information handling system results in the removal of all fans as a single unit from the information handling system.

2. A fan bay for an information handling system, comprising:
   an enclosure having a plurality of slots, each sized to house a fan and each slot arranged to permit the individual hot swapping of each fan;
   latches disposed on opposite sides of the fan bay, wherein each latch is sized to be received and engaged by a receiving bracket in the information handling system, wherein each latch includes a pivotable shoulder for engaging a receiving bracket in the information handling systems;
   wherein the removal of the enclosure from the information handling system results in the removal of all fans as a single unit from the information handling system.

3. The fan bay of claim 2, wherein the lifting of the retractable handle of each latch causes the shoulder of each latch to disengage from a receiving bracket of the information handling system.

4. A fan bay for an information handling system, comprising:
   an enclosure having a plurality of slots, each sized to house a fan and each slot arranged to permit the individual hot swapping of each fan; and
   latches disposed on opposite sides of the fan bay, wherein each latch is sized to be received and engaged by a receiving bracket in the information handling system, wherein each latch includes a retractable handle, wherein each latch includes a pivotable shoulder for engaging a receiving bracket in the information handling system, and wherein the lifting of the retractable handle of each latch causes the shoulder of each latch to disengage from the receiving bracket of the information handling system;
   wherein the enclosure includes openings along its length for the passage of air through the fans of the fan bay;
   wherein the removal of the enclosure from the information handling system results in the removal of all fans as a single unit from the information handling system.

5. A mechanism for securing a fan bay to a chassis of a computer system, comprising:
  a latch coupled to the fan bay;
  a receiving bracket coupled to receive and engage the latch;
  wherein the latch includes a retractable handle; and
  wherein the latch may be disengaged from the receiving bracket when the retractable handle is raised.

6. The mechanism for securing a fan bay to a chassis of a computer system of claim 5,
  wherein the latch includes a pivotable shoulder; and
  wherein the raising of the handle causes the shoulder to pivot to disengage the latch from the receiving bracket.

7. The mechanism for securing a fan bay to a chassis of a computer system of claim 6, wherein the pivotable shoulder of the latch is sized to engage a slot in the receiving bracket when the latch is engaged by the receiving bracket.

8. The mechanism for securing a fan bay to a chassis of a computer system of claim 7, wherein the raising of the handle causes the pivotable shoulder to disengage from the slot in the receiving bracket.

9. The mechanism for securing a fan bay to a chassis of a computer system of claim 8,
  wherein the pivotable shoulder is flanged outward and pivotable inward when the retractable handle is in a down position;
  wherein the placement of the latch in receiving bracket causes the pivotable shoulder to pivot inward under pressure from the sides of the receiving bracket; and
  wherein the pivotable shoulder of each latch flanges outward when the pivotable shoulder is aligned proximate the slots of the receiving bracket.

10. An information handling system, comprising:
  a chassis;
  a processor;
  memory;
  a removable fan bay, wherein the fan bay includes a number of slots sized to receive a fan, and wherein each fan is individually hot swappable;
  latches coupled to opposite sides of the fan bay, wherein each latch includes a retractable handle; and
  receiving brackets coupled to the interior sides of the chassis, with each receiving bracket sized to receive a corresponding latch;
  wherein the lifting of each retractable handle causes each latch to disengage from a receiving bracket;
  wherein the removal of the fan bay results in the removal of all fans of the fan bay.

11. An information handling system, comprising:
  a chassis;
  a processor;
  memory;
  a removable fan bay, wherein the fan bay includes a number of slots sized to receive a fan, and wherein each fan is individually hot swappable;
  latches coupled to opposite sides of the fan bay, wherein each latch includes a retractable handle; and
  receiving brackets coupled to the interior sides of the chassis, with each receiving bracket sized to receive a corresponding latch;
  wherein each latch includes a pivotable shoulder for engaging a receiving bracket;
  wherein the removal of the fan bay results in the removal of all fans of the fan bay.

12. The information handling system of claim 11, wherein the lifting of the retractable handle of each latch causes the shoulder of each latch to disengage from a receiving bracket.

* * * * *